US012748149B2

(12) United States Patent
Ruan

(10) Patent No.: US 12,748,149 B2
(45) Date of Patent: Sep. 29, 2026

(54) BATTERY CURRENT MONITORING METHOD, CONTROLLER AND CIRCUIT

(71) Applicant: HUIZHOU ROYPOW TECHNOLOGY CO., LTD, Huizhou (CN)

(72) Inventor: Tingjun Ruan, Huizhou (CN)

(73) Assignee: HUIZHOU ROYPOW TECHNOLOGY CO., LTD, Huizhou (CN)

( * ) Notice: Subject to any disclaimer, the term of this patent is extended or adjusted under 35 U.S.C. 154(b) by 515 days.

(21) Appl. No.: 18/382,842

(22) Filed: Oct. 23, 2023

(65) Prior Publication Data

US 2024/0133956 A1 Apr. 25, 2024
US 2024/0230766 A9 Jul. 11, 2024

(30) Foreign Application Priority Data

Oct. 24, 2022 (CN) ......................... 202211302960.4

(51) Int. Cl.
*G01R 31/36* (2020.01)
*G01R 15/20* (2006.01)
*G01R 19/25* (2006.01)

(52) U.S. Cl.
CPC ....... *G01R 31/3648* (2013.01); *G01R 15/202* (2013.01); *G01R 19/2503* (2013.01)

(58) Field of Classification Search
CPC .............. G01R 15/202; G01R 19/0092; G01R 19/2503; G01R 31/3648; G01R 31/382; Y02E 60/10
See application file for complete search history.

(56) References Cited

U.S. PATENT DOCUMENTS

2001/0030618 A1* 10/2001 Endoh ................. H03M 1/1038 341/120
2009/0195430 A1* 8/2009 Yamamoto .......... H03M 1/1033 341/155

(Continued)

FOREIGN PATENT DOCUMENTS

CN 104076196 B 2/2017
CN 208043907 U 11/2018

OTHER PUBLICATIONS

Chinese Patent Office: Office Action of CN 202211302960.4 (related application); Apr. 3, 2023; Chen, Weiwei; 6 pages.

*Primary Examiner* — Yoshihisa Ishizuka

(57) ABSTRACT

The present disclosure relates to a battery current monitoring method, a controller and a circuit. The method is applied to a current monitoring circuit, the current monitoring circuit includes a hall sensor, a controller and a constant voltage source. The current monitoring method includes: acquiring, by the controller, an output voltage of the constant voltage source and a first analog-to-digital conversion value of the output voltage of the constant voltage source; determining an analog-to-digital conversion correction coefficient based on the output voltage of the constant voltage source and the first analog-to-digital conversion value; acquiring a second analog-to-digital conversion value of an output voltage of the hall sensor and a third analog-to-digital conversion value of a supply voltage of the hall sensor; and determining the battery current based on the analog-to-digital conversion correction coefficient, the second analog-to-digital conversion value and the third analog-to-digital conversion value.

20 Claims, 9 Drawing Sheets

(56) References Cited

U.S. PATENT DOCUMENTS

| | | | | |
|---|---|---|---|---|
| 2019/0113550 | A1* | 4/2019 | Hong | G01R 33/0082 |
| 2019/0120924 | A1* | 4/2019 | Hou | G01R 35/005 |

* cited by examiner

BATTERY CURRENT MONITORING METHOD, CONTROLLER AND CIRCUIT

CROSS-REFERENCE TO RELATED APPLICATIONS

The present application claims priority to Chinese patent application No. 202211302960.4, filed on Oct. 24, 2022, entitled "BATTERY CURRENT MONITORING METHOD, CONTROLLER AND CIRCUIT", the entire content of which is incorporated herein by reference.

TECHNICAL FIELD

The present disclosure relates to the field of current monitoring technology, and in particular, to a battery current monitoring method, a controller and a circuit.

BACKGROUND

With the development of the electronics field, a battery management system is used more and more widely, so a method to measure a battery current in the battery management system is needed.

At present, hall sensors are usually used to directly measure the battery current in the battery management system. However, due to an instability of a power supply voltage of the hall sensor, an instability of the power supply of the measuring system itself, a zero deviation of the hall sensor itself and other problems, the current measured by the above current measurement method has a large error.

SUMMARY

In a first aspect, the present disclosure provides a battery current monitoring method, applied to a controller in a current monitoring circuit, the current monitoring circuit further includes a hall sensor and a constant voltage source, an output terminal of the constant voltage source is connected to a first input terminal of the controller, an output terminal of the hall sensor is connected to a second input terminal of the controller, a power supply terminal of the hall sensor is connected to a third input terminal of the controller, and the hall sensor is arranged within a power bus of the battery, the current monitoring method includes:

acquiring an output voltage of the constant voltage source and a first analog-to-digital conversion value of the output voltage of the constant voltage source;

determining an analog-to-digital conversion correction coefficient based on the output voltage of the constant voltage source and the first analog-to-digital conversion value, the analog-to-digital conversion correction coefficient representing a voltage value corresponding to a unit analog-to-digital conversion value at the time of sampling of the controller;

acquiring a second analog-to-digital conversion value of an output voltage of the hall sensor and a third analog-to-digital conversion value of a supply voltage of the hall sensor; and determining the battery current based on the analog-to-digital conversion correction coefficient, the second analog-to-digital conversion value, and the third analog-to-digital conversion value.

In an embodiment, the determining the battery current based on the analog-to-digital conversion correction coefficient, the second analog-to-digital conversion value, and the third analog-to-digital conversion value includes:

determining the output voltage of the hall sensor based on the second analog-to-digital conversion value and the analog-to-digital conversion correction coefficient;

determining the supply voltage of the hall sensor based on the third analog-to-digital conversion value and the analog-to-digital conversion correction coefficient; and determining the battery current based on the output voltage of the hall sensor and the supply voltage of the hall sensor.

In an embodiment, the determining the output voltage of the hall sensor based on the second analog-to-digital conversion value and the analog-to-digital conversion correction coefficient includes:

determining an intermediate value of the output voltage of the hall sensor based on the second analog-to-digital conversion value and the analog-to-digital conversion correction coefficient;

acquiring a zero-point deviation value of the hall sensor; the zero-point deviation value of the hall sensor representing a deviation between a theoretical value and an actual measured value of the output voltage of the hall sensor in the absence of current passing through the power bus of the battery; and determining the output voltage of the hall sensor based on the zero-point deviation value and the intermediate value of the hall sensor.

In an embodiment, the acquiring the zero-point deviation value of the hall sensor includes:

acquiring the output voltage and the supply voltage of the hall sensor in the absence of current passing through the power bus of the battery; and determining the zero-point deviation value of the hall sensor based on the output voltage and the supply voltage of the hall sensor.

In an embodiment, the acquiring the output voltage and the supply voltage of the hall sensor in the absence of current passing through the power bus of the battery includes:

acquiring the second analog-to-digital conversion value of the output voltage of the hall sensor and the analog-to-digital conversion correction coefficient in the absence of current passing through the power bus of the battery; and determining the output voltage of the hall sensor based on the second analog-to-digital conversion value of the output voltage of the hall sensor and the analog-to-digital conversion correction coefficient.

In an embodiment, the current monitoring circuit further includes a first voltage dividing circuit having an input terminal connected to the output terminal of the hall sensor, and an output terminal connected to the second input terminal of the controller, the determining the output voltage of the hall sensor based on the second analog-to-digital conversion value and the analog-to-digital conversion correction coefficient includes:

acquiring a first voltage dividing coefficient of the first voltage dividing circuit; and determining the output voltage of the hall sensor based on the first voltage dividing coefficient, the second analog-to-digital conversion value, and the analog-to-digital conversion correction coefficient.

In an embodiment, the current monitoring circuit further includes a second voltage dividing circuit having an input terminal connected to the power supply terminal of the hall sensor, and an output terminal connected to the third input terminal of the controller, the determining the supply voltage of the hall sensor based on the third analog-to-digital conversion value and the analog-to-digital conversion correction coefficient includes:

acquiring a second voltage dividing coefficient of the second voltage dividing circuit; and determining the supply voltage of the hall sensor based on the second voltage dividing coefficient, the third analog-to-digital conversion value, and the analog-to-digital conversion correction coefficient.

In a second aspect, the present disclosure also provides a controller, including a memory and a processor, the memory stores a computer program, wherein the computer program when executed by the processor causes the processor to:

acquire an output voltage of a constant voltage source and a first analog-to-digital conversion value of the output voltage of the constant voltage source;

determine an analog-to-digital conversion correction coefficient based on the output voltage of the constant voltage source and the first analog-to-digital conversion value, the analog-to-digital conversion correction coefficient representing a voltage value corresponding to a unit analog-to-digital conversion value at the time of sampling of the controller;

acquire a second analog-to-digital conversion value of an output voltage of a hall sensor and a third analog-to-digital conversion value of a supply voltage of the hall sensor; and determine the battery current based on the analog-to-digital conversion correction coefficient, the second analog-to-digital conversion value, and the third analog-to-digital conversion value.

In a third aspect, the present disclosure also provides a current monitoring circuit, including a controller, a constant voltage source having an output terminal connected to a first input terminal of the controller, and a hall sensor having an output terminal connected to a second input terminal of the controller, and a power supply terminal connected to a third input terminal of the controller, the hall sensor being arranged within a power bus of a battery, wherein the controller is configured to:

acquire an output voltage of the constant voltage source and a first analog-to-digital conversion value of the output voltage of the constant voltage source;

determine an analog-to-digital conversion correction coefficient based on the output voltage of the constant voltage source and the first analog-to-digital conversion value, the analog-to-digital conversion correction coefficient representing a voltage value corresponding to a unit analog-to-digital conversion value at the time of sampling of the controller;

acquire a second analog-to-digital conversion value of an output voltage of the hall sensor and a third analog-to-digital conversion value of a supply voltage of the hall sensor; and determine the battery current based on the analog-to-digital conversion correction coefficient, the second analog-to-digital conversion value, and the third analog-to-digital conversion value.

One or more embodiments of the present disclosure will be described in detail in the following figures and description. Other features, objects and advantages of this application will become more apparent from the description, drawings, and claims.

DETAILED DESCRIPTION OF THE EMBODIMENTS

In order to facilitate understanding of the present disclosure, the present disclosure will be described more fully below with reference to the relevant accompanying drawings. Embodiments of the present disclosure are presented in the accompanying drawings. However, the present disclosure may be implemented in many different forms and is not limited to the embodiments described herein. Rather, these embodiments are provided for the purpose of making the present disclosure more thorough and comprehensive.

Unless otherwise defined, all technical and scientific terms used herein have the same meaning as commonly understood by those skilled in the technical field to which the present disclosure belongs. The terms used herein in the specification of the disclosure are for the purpose of describing specific embodiments only, and are not intended to limit the disclosure.

It will be understood that the terms "first", "second", etc. used in this disclosure may be used herein to describe various elements, but these elements are not limited by these terms. These terms are only used to distinguish the first element from another element.

It should be noted that when an element is referred to as being "connected to" another element, it can be directly connected to another element or connected to another element through a intervening element. In addition, the "connected" in the following embodiments should be understood as "electrically connected", "connected by communication", etc. if there is transmission of electrical signals or data between the objects to be connected.

As used herein, the singular forms "a", "an" and "the" may also include the plural forms, unless the context clearly indicates otherwise. It should also be understood that the terms "includes/comprises" or "has" etc. designate the presence of stated features, integers, steps, operations, components, parts or combinations thereof, but do not preclude the possibility of the presence or addition of one or more other features, integers, steps, operations, components, parts or combinations thereof.

Figure 1:
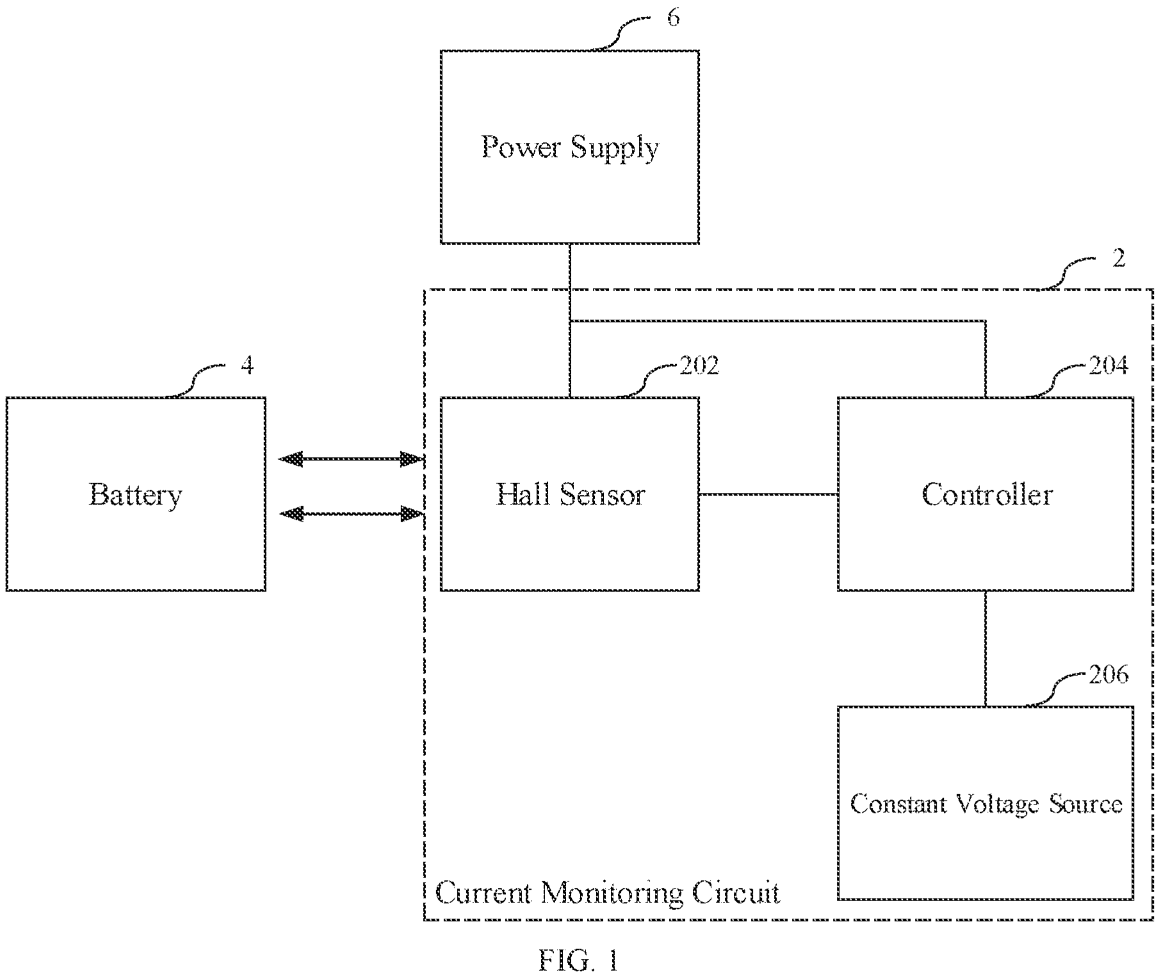
FIG. 1 is a schematic diagram illustrating a configuration of a battery current monitoring circuit in an embodiment.
Figure 2:
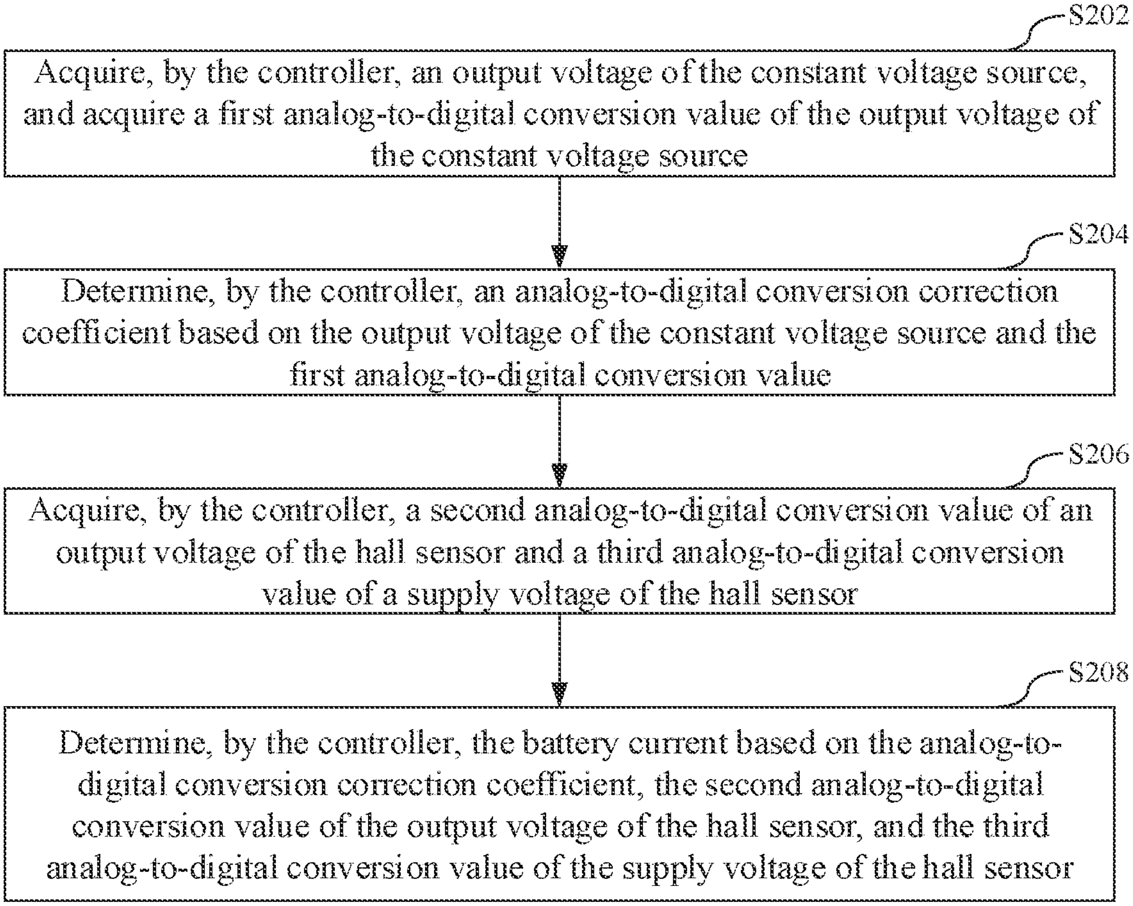
FIG. 2 is a flowchart of a battery current monitoring method in an embodiment.

In an embodiment, as shown in FIGS. 1-2, a battery current monitoring method is provided. In an illustrative example where the method is applied to a controller 204 of a battery current monitoring circuit as shown in FIG. 1, the current monitoring circuit 2 further includes a hall sensor 202 and a constant voltage source 206. An output terminal of the constant voltage source 206 is connected to a first input terminal of the controller 204, an output terminal of the hall sensor 202 is connected to a second input terminal of the controller 204, a power supply terminal of the hall sensor 202 is connected to a third input terminal of the controller 204, and the hall sensor 202 is arranged within a power bus of the battery. The current monitoring method includes following steps S202-S208.

At step S202, an output voltage of the constant voltage source is acquired and a first analog-to-digital conversion value of the output voltage of the constant voltage source is acquired.

The constant voltage source is a high precision reference voltage source, which has high precision, low noise, and small error range of voltage jump. The output voltage of the constant voltage source matches a supply voltage of the controller, that is, it cannot exceed the supply voltage of the controller and is not zero. The specific value of the output voltage of the constant voltage source can be selected by a person in the field according to the actual needs, and is not limited in the present disclosure. Exemplarily, when the supply voltage of the controller is 3.3V, the output voltage of the constant voltage source should be greater than OV and less than 3.3V. The hall sensor can be an open-loop hall sensor or a closed-loop hall sensor. In a specific embodiment, the hall sensor is the open-loop hall sensor, which makes the current monitoring circuit simple in structure and small in size, and enables a high reliability and a strong overload capacity of the current monitoring circuit. The controller can include but is not limited to MCU (Microcontroller Unit), FPGA (Field Programmable Gate Array) and other types of processing chips, without limitation here. Further, the controller is embedded with an analog-to-digital converter (not shown in the figure). In a specific embodiment, a sampling resolution of the analog-to-digital converter is 12 bits, that is, when the analog-to-digital converter converts an input analog signal to a digital signal, the maximum value of the digital signal that can be represented is 4096. In order to achieve higher sampling accuracy, a person skilled in the art can choose an analog-to-digital converter with a higher sampling resolution, or choose an analog-to-digital converter with a lower sampling resolution in order to save cost, which is not limited in the embodiment. Secondly, the supply voltage of the controller can be 3.3V, that is, the supply voltage of the analog-to-digital converter is also 3.3V, thus making it more versatile. The first input terminal of the controller refers to an analog signal input detection terminal for receiving a constant voltage analog signal output from the output terminal of the constant voltage source. The second input terminal of the controller refers to another analog signal input detection terminal for receiving a voltage analog signal output from the hall sensor after detecting the battery current. The third input terminal of the controller refers to another analog signal receiving terminal for receiving a supply voltage analog signal of the hall sensor. The hall sensor can be powered by a power supply as shown in FIG. 1, and in a specific embodiment, an output voltage of the power supply 6 is 5V. The analog-to-digital conversion value represents a mapping relationship between the analog signal and the corresponding digital signal, that is, the first analog-to-digital conversion value is a digital value of the digital signal corresponding to the analog signal representing the output voltage of the constant voltage source 206, where the digital signal is acquired by analog-to-digital conversion of the analog signal by the analog-to-digital converter.

Specifically, the output voltage of the constant voltage source can be acquired directly from a constant voltage source device with a known output voltage, or acquired by connecting an external device with an unknown output voltage to the controller which acquires the output voltage by itself after measurement. The first analog-to-digital conversion value of the output voltage of the constant voltage source can be acquired by inputting the output voltage of the constant voltage source to the first input terminal of the controller, after the controller performs analog-to-digital conversion. Exemplarily, if the voltage output from the constant voltage source is $V_{erve}$, $v_{erve}$ is then input to the controller, and the first analog-to-digital conversion value corresponding to $V_{ref}$ is $AD_{ref}$ after conversion by the controller. More specifically, for example, when $V_{ref}$ is 2.5V, the corresponding analog-to-digital conversion value $AD_{ref}$ is 3100 after the analog-to-digital conversion of the controller, that is, the 3100 corresponding to $AD_{ref}$ is the first analog-to-digital conversion value when $V_{ref}$ is 2.5V.

At step S204, an analog-to-digital conversion correction coefficient is determined by the controller based on the output voltage of the constant voltage source and the first analog-to-digital conversion value. The analog-to-digital conversion correction coefficient represents a voltage value corresponding to a unit analog-to-digital conversion value at the time of sampling of the controller.

Specifically, in the case where the output voltage of the constant voltage source and the first analog-to-digital conversion value are determined, the analog-to-digital conversion correction coefficient can be calculated by a mapping model between the output voltage of the constant voltage source and the first analog-to-digital conversion value. Exemplarily, in the case where the output voltage of the constant voltage source is $V_{ref}$ and the first analog-to-digital conversion value is $AD_{ref}$, the above mapping model is denoted by $U_p=V_{ref}/AD_{ref}$, where $U_p$ is the analog-to-digital conversion correction coefficient. In a specific embodiment, when $V_{ref}$ is 2.5V and the corresponding analog-to-digital conversion value $AD_{ref}$ is 3100 after the analog-to-digital conversion of the controller, then the analog-to-digital conversion correction coefficient $U_p$ is 2500/3100=0.9064 in this case. In this embodiment, the output voltage $V_{ref}$ of the constant voltage source can be adaptively configured according to the needs of the actual disclosure, and is limited here.

At step S206, a second analog-to-digital conversion value of an output voltage of the hall sensor and a third analog-to-digital conversion value of a supply voltage of the hall sensor are acquired by the controller.

The second analog-to-digital conversion value represents a similar meaning as the first analog-to-digital conversion value mentioned in the above embodiment, and will not be repeated here.

Specifically, the second analog-to-digital conversion value of the output voltage of the hall sensor and the third analog-to-digital conversion value of the supply voltage of the hall sensor can be directly acquired and used by the controller by directly inputting a known analog-to-digital conversion value corresponding to an external voltage into the controller, or acquired by the controller by inputting the output voltage of the hall sensor and the supply voltage of the hall sensor with an unknown specific corresponding analog-to-digital conversion value into the controller and performing analog-to-digital conversion to the same by the controller. It should be noted that for the acquisition of the above analog-to-digital conversion values, whether directly or indirectly, the analog-to-digital conversion values are acquired based on a same analog-to-digital conversion standard.

At step S208, the battery current is determined by the controller based on the analog-to-digital conversion correction coefficient, the second analog-to-digital conversion value of the output voltage of the hall sensor, and the third analog-to-digital conversion value of the supply voltage of the hall sensor.

In a specific embodiment, when the analog-to-digital conversion correction coefficient is $U_p$ and the second analog-to-digital conversion value and the third analog-to-digital conversion value are $AD_{UO}$ and $AD_{UV+}$ respectively, then the battery current I can be acquired by the following formula:

$$I = (U_p * AD_{UO} - U_p * AD_{UV} + /2) * G$$

where the G represents an intrinsic gain of a hall current sensor, which is a constant.

In the above method embodiment, a high precision constant voltage source is connected to the first input terminal of the controller in the current monitoring circuit and used as a reference source for subsequent current value calculation. Further, the controller acquires the output voltage of the constant voltage source and the analog-to-digital conversion value of the output voltage of the constant voltage source, based on which, the controller determines the analog-to-digital conversion correction coefficient represented the voltage value corresponding to the unit analog-to-digital conversion value when the controller is sampled. Further, the second analog-to-digital conversion value of the output voltage of the hall sensor and the third analog-to-digital conversion value of the supply voltage of the hall sensor are acquired, and the battery current is finally determined based on the analog-to-digital conversion correction coefficient, thereby realizing a high precision measurement of the battery current.

Figure 3:
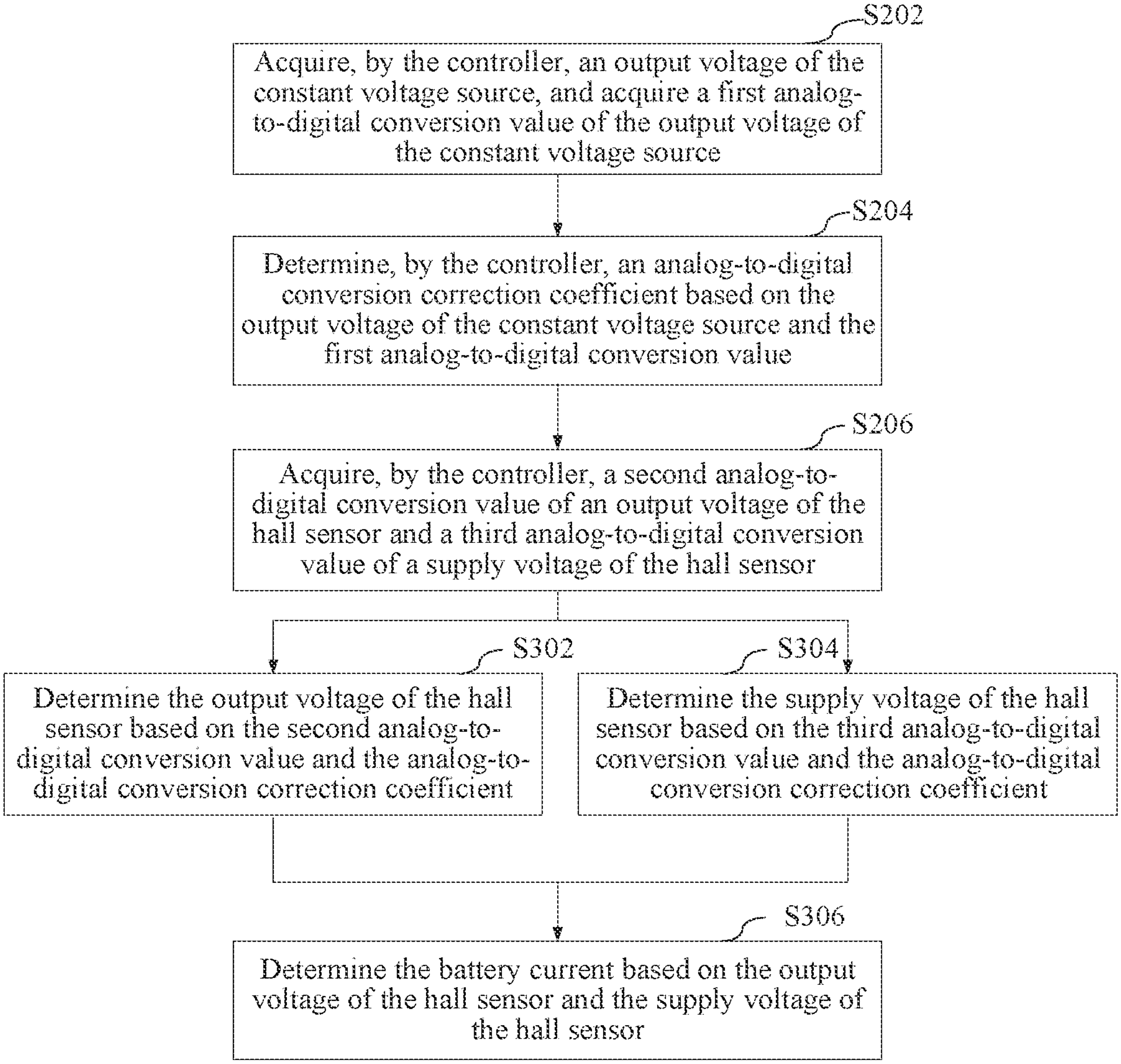
FIG. 3 is a flowchart of a battery current monitoring method in another embodiment.

In an embodiment, as shown in FIG. 3, the controller determining the battery current based on the analog-to-digital conversion correction coefficient, the second analog-to-digital conversion value, and the third analog-to-digital conversion value, includes following steps S302-S306.

At step S302, the output voltage of the hall sensor is determined based on the second analog-to-digital conversion value and the analog-to-digital conversion correction coefficient.

At Step S304, the supply voltage of the hall sensor is determined based on the third analog-to-digital conversion value and the analog-to-digital conversion correction coefficient.

At step S306, the battery current is determined based on the output voltage of the hall sensor and the supply voltage of the hall sensor.

The output voltage of the hall sensor is a voltage output after measurement based on the operating principle of the hall sensor when the hall sensor is arranged within the power bus of the battery.

In a specific embodiment, the second analog-to-digital conversion value and the third analog-to-digital conversion value are $AD_{UO}$ and $AD_{UV+}$ respectively, and the analog-to-digital conversion correction coefficient is $U_p$, then the output voltage $U_O$ of the hall sensor can be acquired by the following formula:

$$Uo = U_p * AD_{UO}$$

The supply voltage $U_{V+}$ of the hall sensor can be acquired by the following formula:

$$U_{V+} = U_p * AD_{UV+}$$

Further, based on the output voltage $U_O$ of the hall sensor and the supply voltage $U_{V+}$ of the hall sensor acquired from the above calculation, the battery current I is determined by the following formula:

$$I = (U_O - U_{V+}/2) * G$$

In the above embodiment, the output voltage of the hall sensor is determined based on the second analog-to-digital conversion value and the analog-to-digital conversion correction coefficient. The supply voltage of the hall sensor is determined based on the third analog-to-digital conversion value and the analog-to-digital conversion correction coefficient, and the battery current is then determined, which provides another calculation method for determining the battery current.

Figure 4:
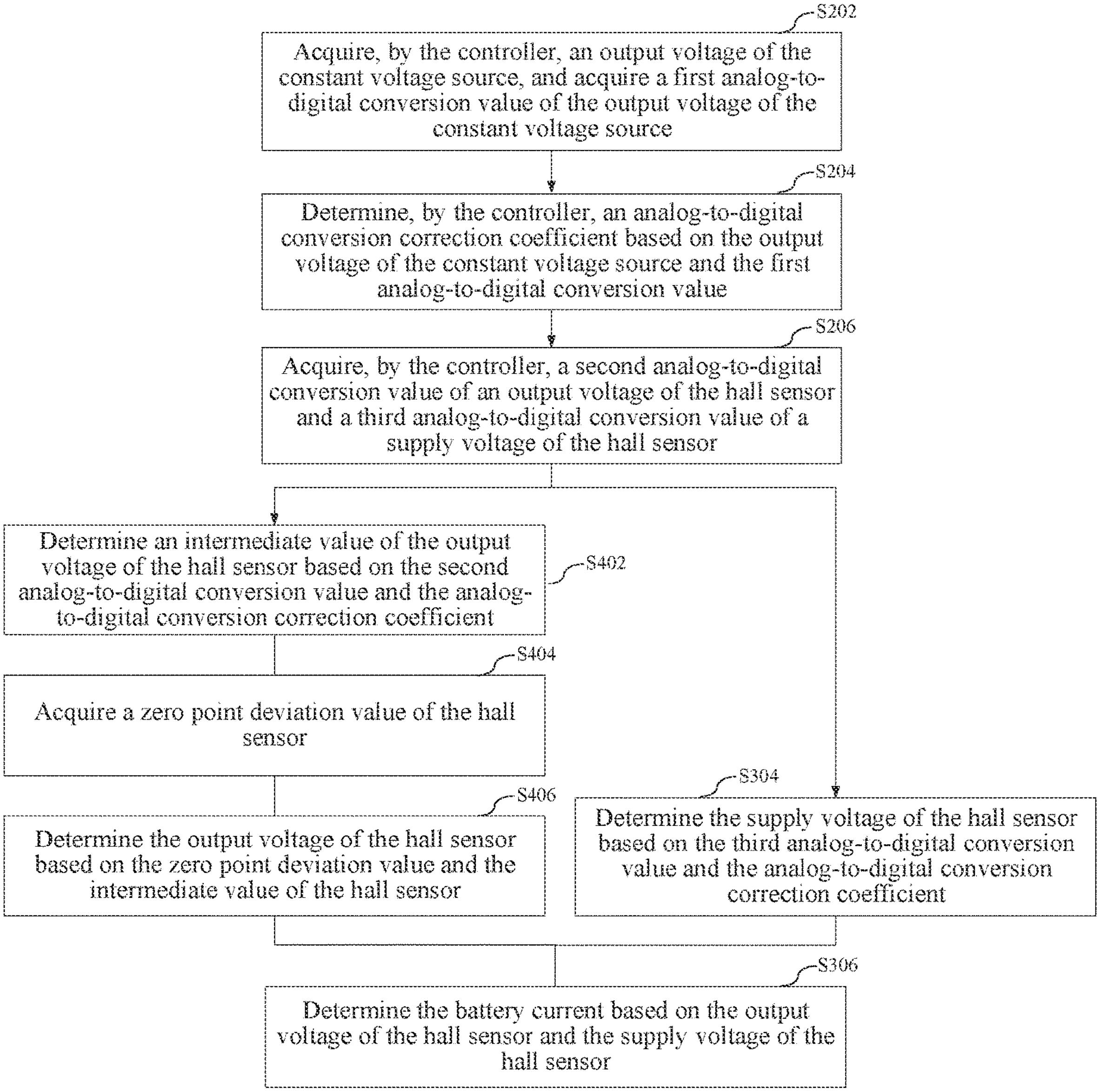
FIG. 4 is a flowchart of a battery current monitoring method in a further embodiment.

In an embodiment, as shown in FIG. 4, the determining the output voltage of the hall sensor based on the second analog-to-digital conversion value and the analog-to-digital conversion correction coefficient, includes following steps S402-S406.

At step S402, an intermediate value of the output voltage of the hall sensor is determined based on the second analog-to-digital conversion value and the analog-to-digital conversion correction coefficient.

The intermediate value of the output voltage of the hall sensor represents a calculated value of the output voltage determined by the second analog-to-digital conversion value and the analog-to-digital conversion correction coefficient.

In a specific embodiment, when the second analog-to-digital conversion value and the analog-to-digital conversion correction coefficient are $AD_{UO}$ and $U_p$ respectively, the intermediate value of the output voltage of the hall sensor can be denoted by $U_S$, and $U_S$ can be acquired by the following formula:

$$U_S = U_p^* AD_{UO}$$

At step S404, a zero-point deviation value of the hall sensor is acquired. The zero-point deviation value of the hall sensor represents a deviation between a theoretical value and an actual measured value of the output voltage of the hall sensor in the absence of current passing through the power bus of the battery.

Specifically, the zero-point deviation value can be acquired externally and directly input into the controller, and can be directly acquired and used by the controller. The zero-point deviation value can also be acquired by inputting a corresponding parameter(s) for calculating the zero-point deviation value into the controller and having the controller perform calculations based on the parameter(s).

Step S406, the output voltage of the hall sensor is determined based on the zero-point deviation value and the intermediate value of the hall sensor.

In a specific embodiment, in the case where the zero-point deviation value and the intermediate value of the hall sensor are $V_{delt}$ and $U_S$ respectively, the output voltage $U_O$ of the hall sensor can be determined by the following formula:

$$U_O = U_S + V_{delt}$$

In the above embodiment, by introducing the zero-point deviation value to the calculation of the output voltage of the hall sensor, the output voltage of the hall sensor is calculated more accurately, which in turn improves the measurement accuracy of the battery current.

Figure 5:
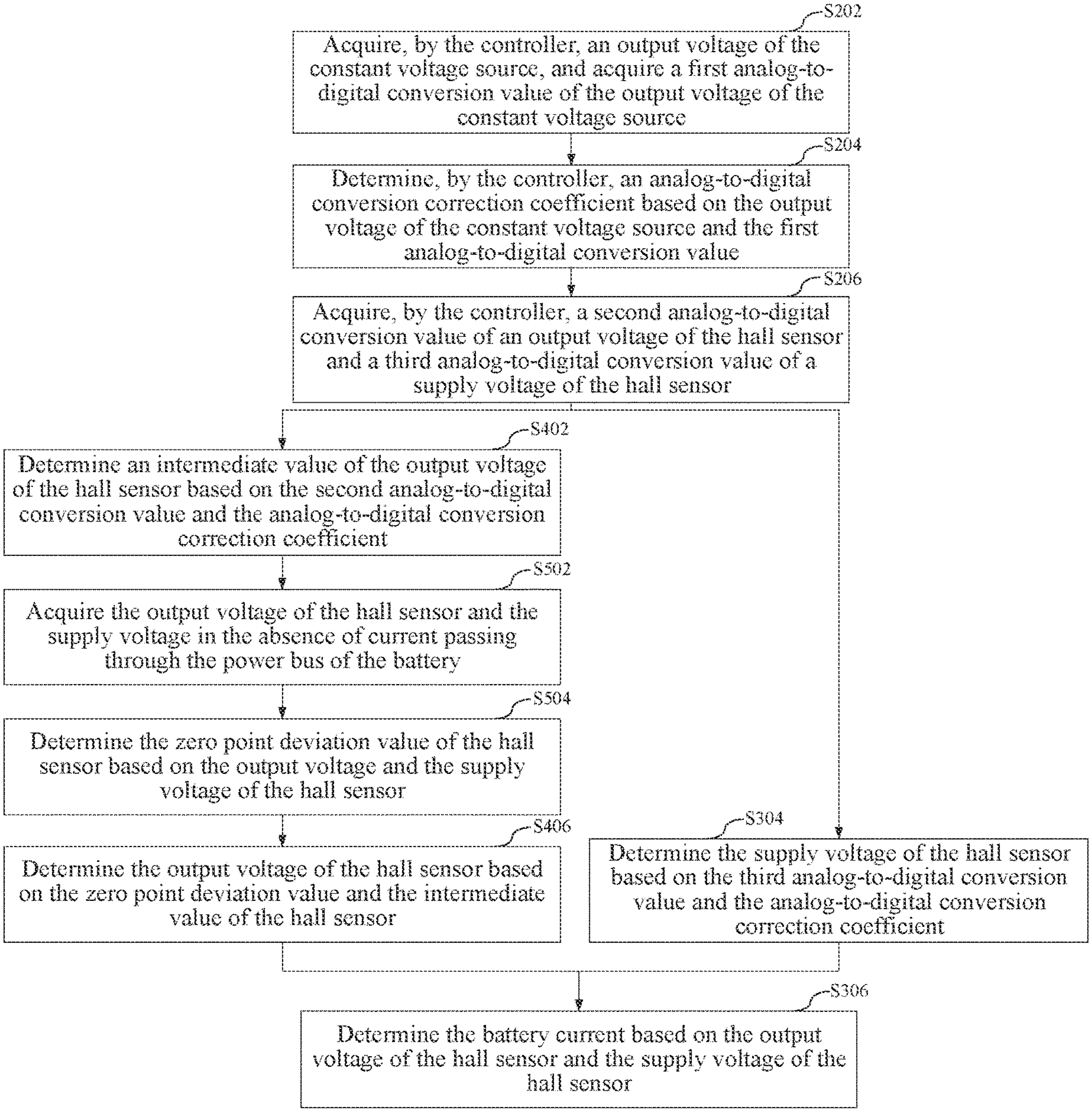
FIG. 5 is a flowchart of a battery current monitoring method in a further embodiment.

In an embodiment, as shown in FIG. 5, the acquiring a zero-point deviation value of the hall sensor, includes following steps S502-S504.

At step S502, the output voltage of the hall sensor and the supply voltage are acquired in the absence of current passing through the power bus of the battery.

At step S504, the zero-point deviation value of the hall sensor is determined based on the output voltage and the supply voltage of the hall sensor.

The output voltage of the hall sensor is a voltage output from the hall sensor in the absence of current passing through the power bus of the battery. As shown in FIG. 1, the supply voltage of the hall sensor refers to a rated voltage of the power supply 6, which is a theoretical supply voltage.

In a specific embodiment, in the absence of current passing through the power bus of the battery, and assuming that the output voltage and supply voltage of the hall sensor are $U_{zero}$ and $U_{V+}$ respectively, the zero-point deviation value $V_{delt}$ can be acquired by the following formula:

$$V_{delt} = U_{V+}/2 - U_{zero}$$

In the above embodiment, by acquiring the output voltage and supply voltage of the hall sensor in the absence of current passing through the power bus of the battery, the zero-point deviation value of the hall sensor is determined, and the monitoring accuracy of the battery current is further improved.

Figure 6:
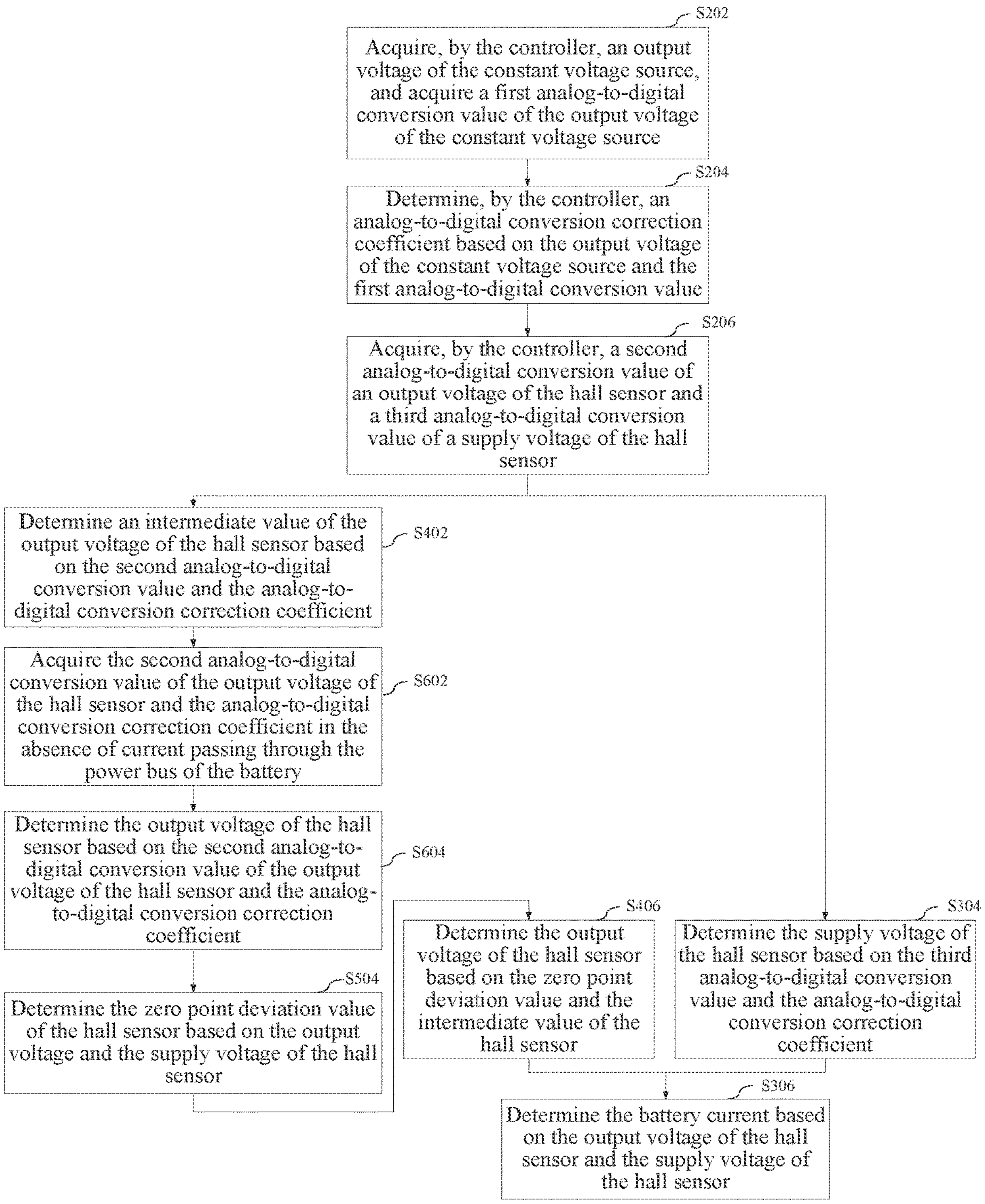
FIG. 6 is a flowchart of a battery current monitoring method in a further embodiment.

In an embodiment, as shown in FIG. 6, the acquiring the output voltage and the supply voltage of the hall sensor in the absence of current passing through the power bus of the battery, includes following steps S602-S604.

At step S602, the second analog-to-digital conversion value of the output voltage of the hall sensor and the analog-to-digital conversion correction coefficient are acquired in the absence of current passing through the power bus of the battery.

At step S604, the output voltage of the hall sensor is determined based on the second analog-to-digital conversion value of the output voltage of the hall sensor and the analog-to-digital conversion correction coefficient.

The second analog-to-digital conversion value is an analog-to-digital conversion value acquired by inputting the output voltage of the hall sensor to the controller for analog-to-digital conversion in the absence of current passing through the power bus of the battery.

In a specific embodiment, when the second analog-to-digital conversion value of the output voltage of the hall sensor is $AD_{U_{zero}}$ and the analog-to-digital conversion correction coefficient is $U_p$ in the above case, then the output voltage $U_{zero}$ of the hall sensor can be determined by the following formula:

$$U_{zero} = U_p * AD_{Uzero}$$

Figure 7:
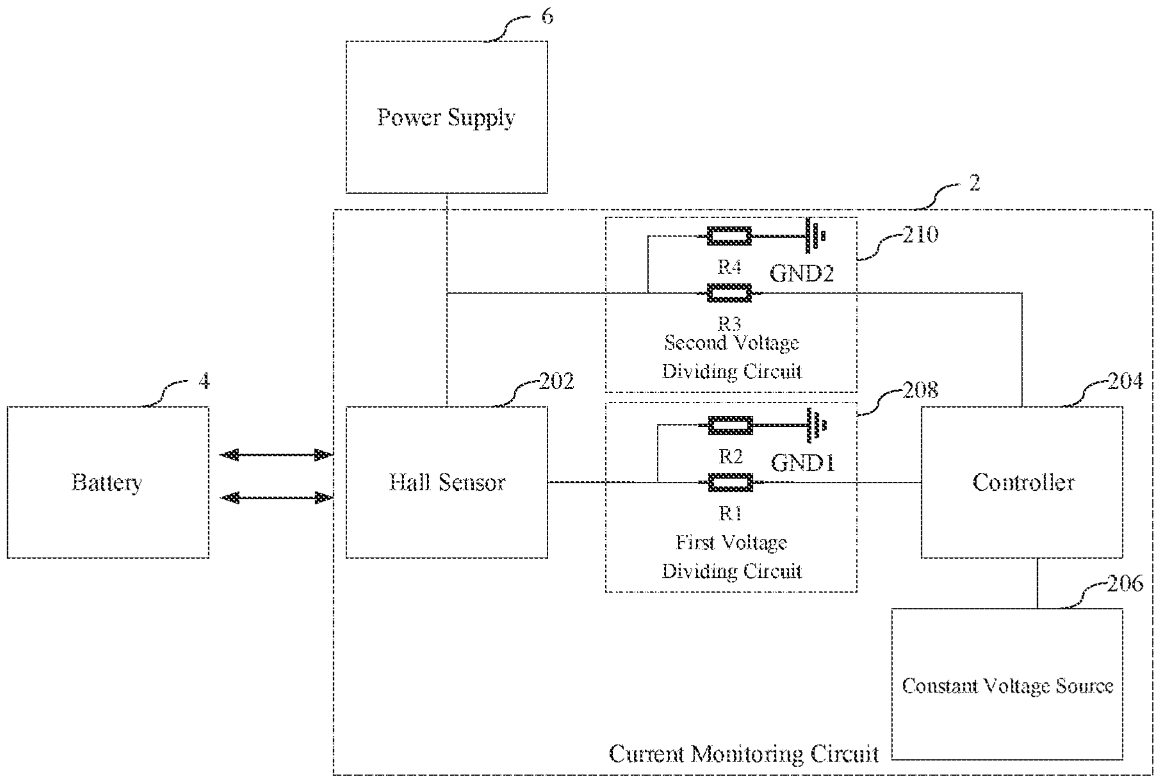
FIG. 7 is a schematic diagram illustrating a configuration of a battery current monitoring circuit in another embodiment.
Figure 8:
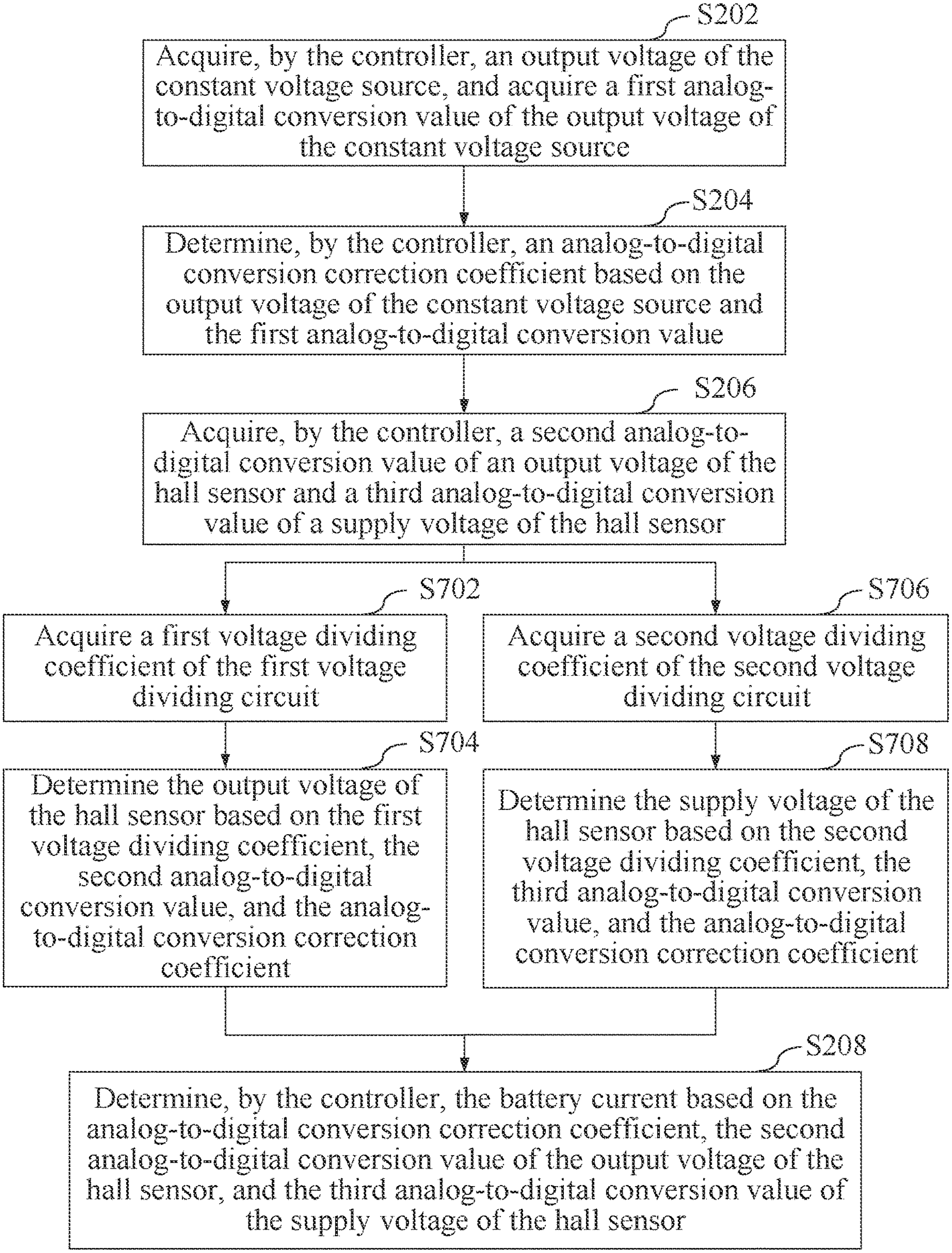
FIG. 8 is a flowchart of a battery current monitoring method in a further embodiment.

In an embodiment, as shown in FIGS. 7-8, the current monitoring circuit 2 further includes a first voltage dividing circuit 208. An input terminal of the first voltage dividing circuit 208 is connected to an output terminal of the hall sensor 204, and an output terminal of the first voltage dividing circuit 208 is connected to the second input terminal of the controller 204. The determining the output voltage of the hall sensor based on the second analog-to-digital conversion value and the analog-to-digital conversion correction coefficient, includes following steps S702-S704.

At step S702, a first voltage dividing coefficient of the first voltage dividing circuit is acquired.

The first voltage dividing circuit is configured to divide the output voltage of the hall sensor when it is input to the controller. In a specific embodiment, as shown in FIG. 7, the first voltage dividing circuit 208 includes at least a resistor R1 and a resistor R2, the resistor R1 is connected in series between the hall sensor and the controller, an input terminal of the resistor R2 is connected to the output terminal of the hall sensor, and an output terminal of the resistor R2 is grounded. The first voltage dividing coefficient refers to a voltage dividing coefficient based on the setting of the resistor in the first voltage dividing circuit 208. Exemplarily, in the first voltage dividing circuit 208 consisting of the resistor R1 and the resistor R2, the first voltage dividing coefficient is $$\frac{R1+R2}{R1}.$$

The specific voltage dividing coefficient can be set according to the resistance values and the number of resistors of the voltage dividing circuit in the actual disclosure, and is not be limited here. Further, it is possible to set R1=R2, and the voltage dividing coefficient is 2, thus making it easier to acquire the voltage dividing coefficient.

At step S704, the output voltage of the hall sensor is determined based on the first voltage dividing coefficient, the second analog-to-digital conversion value, and the analog-to-digital conversion correction coefficient.

In a specific embodiment, when the first voltage dividing coefficient is $$\frac{R1+R2}{R1},$$

the second analog-to-digital conversion value is $AD_{UO}$ and the analog-to-digital conversion correction coefficient is $U_p$, the output voltage of the hall sensor can be acquired by the following formula:

$$U_{O} = U_p * AD_{UO} * \frac{R1+R2}{R1}$$

In the above embodiment, by introducing the first voltage dividing circuit in the current monitoring circuit to divide the output voltage of the hall sensor, so as to ensure that the voltage input to the controller is within a safe range, and avoid the damage and safety issues caused by the excessive input voltage of the controller.

In an embodiment, as shown in FIGS. 7-8, the current monitoring circuit further includes a second voltage dividing circuit 210, an input terminal of the second voltage dividing circuit 210 is connected to the power supply terminal of the hall sensor, and an output terminal of the second voltage dividing circuit is connected to the third input terminal of the controller. The determining the supply voltage of the hall sensor based on the third analog-to-digital conversion value and the analog-to-digital conversion correction coefficient includes following steps S706-S708.

At step S706, a second voltage dividing coefficient of the second voltage dividing circuit is acquired.

As shown in FIG. 7, the structure and function of the second voltage dividing circuit 210 is similar to that of the first voltage dividing circuit 208 in the above embodiment, and will not be repeated here. The meaning and function represented by the second voltage dividing coefficient is similar to that of the first voltage dividing coefficient in the above embodiment, and will not be repeated here.

At step S708, the supply voltage of the hall sensor is determined based on the second voltage dividing coefficient, the third analog-to-digital conversion value, and the analog-to-digital conversion correction coefficient.

In a specific embodiment, when the second voltage dividing coefficient is $$\frac{R3+R4}{R4},$$

the third analog-to-digital conversion value is $AD_V+$ and the analog-to-digital conversion correction coefficient is $U_p$, the supply voltage of the hall sensor can be acquired by the following formula:

$$U_{V+=}U_p*AD_{V+}*\frac{R3+R4}{R4}$$

In the above embodiment, by introducing the second voltage dividing circuit in the current monitoring circuit, the supply voltage of the Hall sensor is divided to ensure that the voltage input to the controller is within a safe range, thus avoiding damage and safety issues caused by the excessive input voltage of the controller.

The solution of the disclosure will be further illustrated with the following specific embodiment which is applied to a battery current monitoring scenario. In this case, as shown in FIG. 7, the output voltage of the high precision constant voltage source 206 is $V_{ref}$, which is input to the first input terminal of the controller 204, the analog-to-digital conversion value of the corresponding voltage acquired by the analog-to-digital converter inside the controller 204 is $AD_{ref}$, then the voltage value corresponding to the unit analog-to-digital conversion value is calculated by the following formula:

$$U_P = V_{ref}/AD_{ref}$$

where $U_p$ is the analog-to-digital conversion correction coefficient.

For example, if the voltage $V_{ref}$ is 2.5V and the analog-to-digital conversion value $AD_{ref}$ converted and acquired by the analog-to-digital converter of the controller 204 is 3100, the voltage value corresponding to the unit analog-to-digital conversion value can be acquired, that is, the analog-to-digital conversion correction coefficient $U_p$ is 2500/3100=0.9064.

Assuming that the supply voltage of hall sensor 202 is $U_V+$, and assuming that the supply voltage of hall sensor 202 is input to controller 204 through the second voltage dividing circuit 210 as shown in FIG. 7, and the corresponding analog-to-digital conversion value acquired by the analog-to-digital converter in the controller 204 is $AD_V+$, then combined with the above analog-to-digital conversion correction coefficient, the $U_{V+}$ with the constant voltage source 206 as a reference can be acquired by the following formula:

$$U_{V+} = Up*AD_V+*\frac{R3+R4}{R4}$$

In the case of no current passing through the power bus of the battery, i.e., within 200 mS before the battery is powered on, the controller 204 acquires the output voltage $U_O$ of the hall sensor 202 from the third input port as $U_{zero}$. Similarly, the $U_{zero}$ with the constant voltage source 206 as the reference can be acquired by combining the current monitoring circuit as shown in FIG. 7 and the following formula:

$$U_{zero} = Up*AD_{Uzero}*\frac{R1+R2}{R1}$$

Based on the specific value of the theoretical supply voltage $U_{V+}$ of the hall sensor 202, the zero-point deviation value $V_{delt}$ of the hall sensor 202 can be determined as:

$$V_{delt} = U_{V+}/2 - U_{zero}$$

where $V_{delt}$ can be a positive or negative value, indicating a deviation value between the theoretical and actual measurement of the output voltage of the hall sensor 202 when no current is passed.

Further, after the battery is powered on for 200 ms, based on the above formula, the output voltage $U_O$ of the hall sensor 202 is acquired as:

$$U_O = Up*AD_{UO}*\frac{R1+R2}{R1}+V_{delt}$$

Finally, the current of the hall sensor 202 is calculated as:

$$I = (Uo+U_V+/2)*G$$

where the G denotes an inherent gain of the hall current sensor and is a fixed value.

Combined with the above formula, the battery current I after powering on can be acquired as:

$$I = \left(U_P*AD_{UO}*\frac{R1+R2}{R1}+V_{delt}-U_P*AD_{V+}*\frac{R3+R4}{R4}/2\right)*G$$

In the above embodiment, the influence of unstable supply voltage of the hall sensor and the operating voltage of the controller itself is eliminated, and the zero-point deviation value is introduced to eliminate the deviation between a theoretical zero-point value and an actual measured zero-point value of the hall sensor, so as to improve the accuracy of current monitoring.

It should be understood that although the individual steps in the flowcharts involved in the embodiments as described above are shown sequentially as indicated by the arrows, the steps are not necessarily performed sequentially in the order indicated by the arrows. Unless explicitly stated herein, these steps are performed in no strict order and they can be performed in any other order. Moreover, at least some of the steps in the flowcharts involved in the embodiments as described above may include multiple steps or multiple stages that are not necessarily performed at the same moment of completion, but may be performed at different moments, and the order in which these steps or stages are performed is not necessarily sequential, but may be performed alternately or alternately with other steps or at least some of the steps or stages in other steps.

Based on the same inventive concept, the present disclosure embodiment also provides a battery current monitoring device for implementing the battery current monitoring method mentioned above. The implementation scheme for solving the problem provided by the device is similar to the implementation scheme recorded in the above method, so the specific limitations in one or more embodiments of the battery current monitoring device provided below can be referred to the limitations for the battery current monitoring method above and will not be repeated herein.

Figure 9:
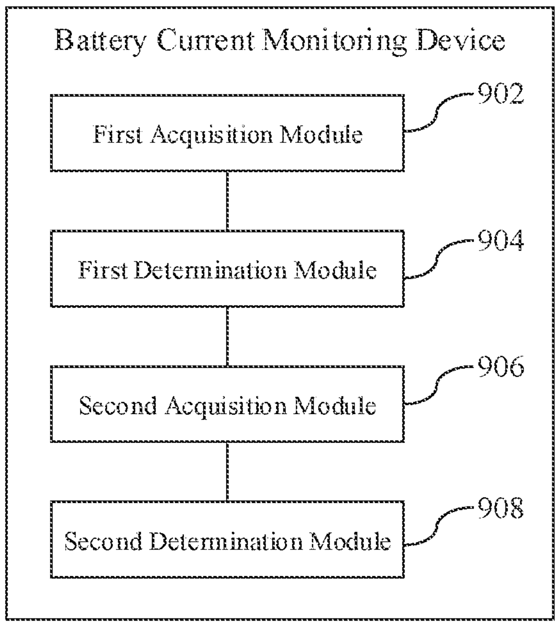
FIG. 9 is a block diagram illustrating a configuration of a current monitoring device of the battery in an embodiment.

In an embodiment, as shown in FIG. 9, the battery current monitoring device is provided, applied to a controller in a current monitoring circuit. The current monitoring circuit further includes a hall sensor and a constant voltage source. An output terminal of the constant voltage source is connected to a first input terminal of the controller, an output terminal of the hall sensor is connected to a second input terminal of the controller, a power supply terminal of the hall sensor is connected to a third input terminal of the controller, and the hall sensor is arranged within a power bus of the battery. The battery current monitoring device includes:

- a first acquisition module 902 configured to acquire an output voltage of the constant voltage source and a first analog-to-digital conversion value of the output voltage of the constant voltage source;
- a first determination module 904 configured to determine an analog-to-digital conversion correction coefficient based on the output voltage of the constant voltage source and the first analog-to-digital conversion value, the analog-to-digital conversion correction coefficient representing a voltage value corresponding to a unit analog-to-digital conversion value at the time of sampling of the controller;
- a second acquisition module 906 configured to acquire a second analog-to-digital conversion value of an output voltage of the hall sensor and a third analog-to-digital conversion value of a supply voltage of the hall sensor; and
- a second determination module 908 configured to determine the battery current based on the analog-to-digital conversion correction coefficient, the second analog-to-digital conversion value, and the third analog-to-digital conversion value.

In an embodiment, the second determination module 908 described above includes:

- a first voltage determination unit configured to determine the output voltage of the hall sensor based on the second analog-to-digital conversion value and the analog-to-digital conversion correction coefficient;
- a second voltage determination unit configured to determine the supply voltage of the hall sensor based on the third analog-to-digital conversion value and the analog-to-digital conversion correction coefficient; and
- a first current determination unit configured to determine the battery current based on the output voltage of the hall sensor and the supply voltage of the hall sensor.

In an embodiment, the first voltage determination unit described above includes:

- a voltage intermediate value determination unit configured to determine an intermediate value of the output voltage of the hall sensor based on the second analog-to-digital conversion value and the analog-to-digital conversion correction coefficient;
- a deviation value acquisition unit configured to acquire a zero-point deviation value of the hall sensor, the zero-point deviation value of the hall sensor representing a deviation between a theoretical value and an actual measured value of the output voltage of the hall sensor in the absence of current passing through the power bus of the battery; and
- a third voltage determination unit configured to determine the output voltage of the hall sensor based on the zero-point deviation value and the intermediate value of the hall sensor.

In an embodiment, the deviation value acquisition unit described above includes:

- a first voltage acquisition unit configured to acquire the output voltage and the supply voltage of the hall sensor in the absence of current passing through the power bus of the battery; and
- a deviation value determination unit configured to determine the zero-point deviation value of the hall sensor based on the output voltage and the supply voltage of the hall sensor.

In an embodiment, the first voltage acquisition unit described above includes:

- a value acquisition unit configured to acquire the second analog-to-digital conversion value of the output voltage of the hall sensor and the analog-to-digital conversion correction coefficient in the absence of current passing through the power bus of the battery; and
- a zero-point voltage determination unit configured to determine the output voltage of the hall sensor based on the second analog-to-digital conversion value of the output voltage of the hall sensor and the analog-to-digital conversion correction coefficient.

In an embodiment, the first voltage determination unit described above further includes:

- a first voltage dividing coefficient acquisition unit configured to acquire a first voltage dividing coefficient of the first voltage dividing circuit; and
- a fourth voltage determination unit configured to determine the output voltage of the hall sensor based on the first voltage dividing coefficient, the second analog-to-digital conversion value, and the analog-to-digital conversion correction coefficient.

In an embodiment, the second voltage determination unit described above further includes:

a second voltage dividing coefficient acquisition unit configured to acquire a second voltage dividing coefficient of the second voltage dividing circuit; and a fifth voltage determination unit configured to determine the supply voltage of the hall sensor based on the second voltage dividing coefficient, the third analog-to-digital conversion value, and the analog-to-digital conversion correction coefficient.

The individual modules in the above battery current monitoring device can be implemented in whole or in part by software, hardware and combinations thereof. Each of the above modules can be embedded in or independent of the processor in the computer device in hardware form, or can be stored in the memory in the computer device in software form, so that the processor can be called to perform the corresponding operations of the above modules.

Figure 10:
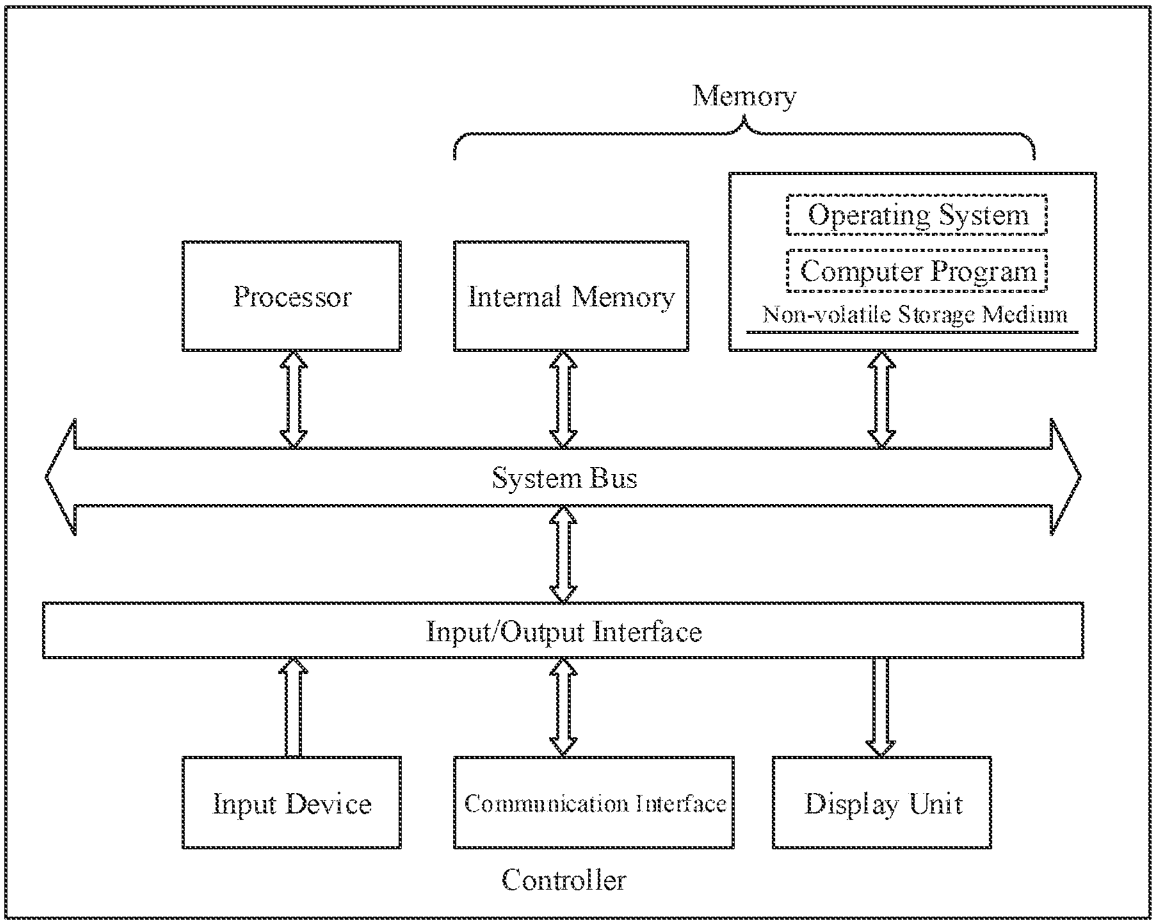
FIG. 10 is a diagram showing an internal configuration of a controller in an embodiment.

In an embodiment, a controller is provided, which can be a terminal, and its internal structure can be as shown in FIG. 10. The controller includes a processor, a memory, an input/output interface, a communication interface, a display unit and an input device. The processor, the memory and the input/output interface are connected through a system bus, and the communication interface, the display unit and the input device are connected to the system bus through the input/output interface. The processor of the controller is configured to provide computing and control capabilities. The memory of the controller includes a non-volatile storage medium and an internal memory. The non-volatile storage medium stores an operating system and a computer program. This internal memory provides an environment for the operation of operating systems and computer programs in the non-volatile storage medium. The input/output interface of the controller is configured to exchange information between the processor and external devices. The communication interface of the controller is configured to communicate with external terminals in wired or wireless mode. The wireless mode can be implemented through WIFI, mobile cellular network, NFC (Near Field Communication) or other technologies. The computer program is executed by the processor in order to implement the battery current monitoring method. The display unit of the controller is configured to form a visually visible picture, which can be a display screen, a projection device or a virtual reality imaging device. The display screen can be a liquid crystal display screen or an e-ink display screen. The input device of the controller can be a touch layer covered on the display screen, or a button, trackball or touchpad set on the controller shell, or an external keyboard, touchpad or mouse, etc.

Those skilled in the art can understand that the structure shown in FIG. 10 is only a block diagram of a portion of the structure associated with the scheme of the present disclosure, and does not constitute a limitation of the controller applied to the scheme of the present disclosure. The specific controller can include more or fewer components than shown in the figure, or combine certain components, or have a different arrangement of components.

Those skilled in the art can understand that the structure shown in FIG. 10 is only a block diagram of a portion of the structure associated with the scheme of the present disclosure, and does not constitute a limitation of the computer device applied to the scheme of the present disclosure. The specific computer device can include more or fewer components than shown in the figure, or combine certain components, or have a different arrangement of components.

In an embodiment, a controller is provided, including a memory and a processor. The memory stores computer programs, and the processor implements the steps in the above method embodiments when executing computer programs.

In an embodiment, a current monitoring circuit is provided, including:

a controller as described in the above embodiment;

a constant voltage source having an output terminal connected to a first input terminal of the controller; and a hall sensor having an output terminal connected to a second input terminal of the controller, and a power supply terminal connected to a third input terminal of the controller. The hall sensor is arranged within a power bus of the battery.

In an embodiment, a computer readable storage medium is provided on which a computer program is stored, and the computer program implements the steps in the above method embodiments when executed by the processor.

In an embodiment, a computer program product is provided, including a computer program, which is executed by the processor to implement the steps in the above method embodiments.

A person of ordinary skill in the art can understand that implementing all or part of the processes in the methods of the above embodiments can be completed by instructing the relevant hardware through a computer program. The computer program can be stored in a non-volatile computer-readable storage medium. When the computer program is executed, it can include the processes in the embodiments of the above methods. Any reference to memory, database or other medium used in the embodiments provided in this disclosure can include at least one of a non-volatile and a volatile memory. The non-volatile memory can include a read-only memory (ROM), a magnetic tape, a floppy disk, a flash memory, an optical memory, a high-density embedded non-volatile memory, a resistive random access memory (ReRAM), a magnetoresistive random access memory (MRAM), a ferroelectric random access memory (FRAM), a phase change memory (PCM), and a graphene memory, etc. The volatile memory can include a random access memory (RAM) or an external cache memory, etc. As an illustration rather than a limitation, the random access memory can be in various forms, such as a static random access memory (SRAM) or a dynamic random access memory (DRAM). The databases involved in the embodiments provided by the present disclosure can include at least one of a relational database and a non-relational database. The non-relational database can include, without limitation, a blockchain-based distributed database, etc. The processor involved in the embodiments provided by the present disclosure can be a general purpose processor, a central processor, a graphics processor, a digital signal processor, a programmable logic device, a data processing logic device based on quantum computation, and the like, without limitation.

The technical features of the above embodiments can be combined arbitrarily. In order to make the description concise, not all possible combinations of the technical features in the above embodiments are described. However, as long as the combination of these technical features is not contradictory, it should be considered as the scope of this description.

The above embodiments only express several implementations of the present disclosure, and their description is specific and detailed, but should not be understood as a limitation on the scope of the present disclosure. It should be pointed out that for those skilled in the art may further make variations and improvements without departing from the conception of the present disclosure, and these fall within the protection scope of the present disclosure. Therefore, the protection scope of the present disclosure should be subject to the appended claims.

What is claimed is:

1. A battery current monitoring method, applied to a controller in a current monitoring circuit, the current monitoring circuit further comprising a hall sensor and a constant voltage source, an output terminal of the constant voltage source being connected to a first input terminal of the controller, an output terminal of the hall sensor being connected to a second input terminal of the controller, a power supply terminal of the hall sensor being connected to a third input terminal of the controller, and the hall sensor being arranged within a power bus of the battery, the current monitoring method comprising:

acquiring an output voltage of the constant voltage source and a first analog-to-digital conversion value of the output voltage of the constant voltage source;

determining an analog-to-digital conversion correction coefficient based on the output voltage of the constant voltage source and the first analog-to-digital conversion value, the analog-to-digital conversion correction coefficient representing a voltage value corresponding to a unit analog-to-digital conversion value at the time of sampling of the controller;

acquiring a second analog-to-digital conversion value of an output voltage of the hall sensor and a third analog-to-digital conversion value of a supply voltage of the hall sensor; and determining the battery current based on the analog-to-digital conversion correction coefficient, the second analog-to-digital conversion value, and the third analog-to-digital conversion value.

2. The battery current monitoring method according to claim 1, wherein the determining the battery current based on the analog-to-digital conversion correction coefficient, the second analog-to-digital conversion value, and the third analog-to-digital conversion value comprises:

determining the output voltage of the hall sensor based on the second analog-to-digital conversion value and the analog-to-digital conversion correction coefficient;

determining the supply voltage of the hall sensor based on the third analog-to-digital conversion value and the analog-to-digital conversion correction coefficient; and determining the battery current based on the output voltage of the hall sensor and the supply voltage of the hall sensor.

3. The battery current monitoring method according to claim 2, wherein the determining the output voltage of the hall sensor based on the second analog-to-digital conversion value and the analog-to-digital conversion correction coefficient comprises:

determining an intermediate value of the output voltage of the hall sensor based on the second analog-to-digital conversion value and the analog-to-digital conversion correction coefficient;

acquiring a zero-point deviation value of the hall sensor, the zero-point deviation value of the hall sensor representing a deviation between a theoretical value and an actual measured value of the output voltage of the hall sensor in the absence of current passing through the power bus of the battery; and determining the output voltage of the hall sensor based on the zero-point deviation value and the intermediate value of the hall sensor.

4. The battery current monitoring method according to claim 3, wherein the acquiring the zero-point deviation value of the hall sensor comprises:

acquiring the output voltage and the supply voltage of the hall sensor in the absence of current passing through the power bus of the battery; and determining the zero-point deviation value of the hall sensor based on the output voltage and the supply voltage of the hall sensor.

5. The battery current monitoring method according to claim 4, wherein the acquiring the output voltage and the supply voltage of the hall sensor in the absence of current passing through the power bus of the battery comprises:

acquiring the second analog-to-digital conversion value of the output voltage of the hall sensor and the analog-to-digital conversion correction coefficient in the absence of current passing through the power bus of the battery; and determining the output voltage of the hall sensor based on the second analog-to-digital conversion value of the output voltage of the hall sensor and the analog-to-digital conversion correction coefficient.

6. The battery current monitoring method according to claim 2, wherein the current monitoring circuit further comprises a first voltage dividing circuit having an input terminal connected to the output terminal of the hall sensor, and an output terminal connected to the second input terminal of the controller, the determining the output voltage of the hall sensor based on the second analog-to-digital conversion value and the analog-to-digital conversion correction coefficient comprising:

acquiring a first voltage dividing coefficient of the first voltage dividing circuit; and determining the output voltage of the hall sensor based on the first voltage dividing coefficient, the second analog-to-digital conversion value, and the analog-to-digital conversion correction coefficient.

7. The battery current monitoring method according to claim 2, wherein the current monitoring circuit further comprises a second voltage dividing circuit having an input terminal connected to the power supply terminal of the hall sensor, and an output terminal connected to the third input terminal of the controller, the determining the supply voltage of the hall sensor based on the third analog-to-digital conversion value and the analog-to-digital conversion correction coefficient comprising:

acquiring a second voltage dividing coefficient of the second voltage dividing circuit; and determining the supply voltage of the hall sensor based on the second voltage dividing coefficient, the third analog-to-digital conversion value, and the analog-to-digital conversion correction coefficient.

8. A controller, comprising a memory and a processor, the memory storing a computer program, wherein the computer program, when executed by the processor, causes the processor to:

acquire an output voltage of a constant voltage source and a first analog-to-digital conversion value of the output voltage of the constant voltage source;

determine an analog-to-digital conversion correction coefficient based on the output voltage of the constant voltage source and the first analog-to-digital conversion value, the analog-to-digital conversion correction coefficient representing a voltage value corresponding to a unit analog-to-digital conversion value at the time of sampling of the controller;

acquire a second analog-to-digital conversion value of an output voltage of a hall sensor and a third analog-to-digital conversion value of a supply voltage of the hall sensor; and determine a battery current based on the analog-to-digital conversion correction coefficient, the second analog-to-digital conversion value, and the third analog-to-digital conversion value.

9. The controller according to claim 8, wherein the determining the battery current based on the analog-to-digital conversion correction coefficient, the second analog-to-digital conversion value, and the third analog-to-digital conversion value comprises:

determining the output voltage of the hall sensor based on the second analog-to-digital conversion value and the analog-to-digital conversion correction coefficient;

determining the supply voltage of the hall sensor based on the third analog-to-digital conversion value and the analog-to-digital conversion correction coefficient; and determining the battery current based on the output voltage of the hall sensor and the supply voltage of the hall sensor.

10. The controller according to claim 9, wherein the determining the output voltage of the hall sensor based on the second analog-to-digital conversion value and the analog-to-digital conversion correction coefficient comprises:

determining an intermediate value of the output voltage of the hall sensor based on the second analog-to-digital conversion value and the analog-to-digital conversion correction coefficient;

acquiring a zero-point deviation value of the hall sensor, the zero-point deviation value of the hall sensor representing a deviation between a theoretical value and an actual measured value of the output voltage of the hall sensor in the absence of current passing through the power bus of the battery; and determining the output voltage of the hall sensor based on the zero-point deviation value and the intermediate value of the hall sensor.

11. The controller according to claim 10, wherein the acquiring the zero-point deviation value of the hall sensor comprises:

acquiring the output voltage and the supply voltage of the hall sensor in the absence of current passing through the power bus of the battery; and determining the zero-point deviation value of the hall sensor based on the output voltage and the supply voltage of the hall sensor.

12. The controller according to claim 11, wherein the acquiring the output voltage and the supply voltage of the hall sensor in the absence of current passing through the power bus of the battery comprises:

acquiring the second analog-to-digital conversion value of the output voltage of the hall sensor and the analog-to-digital conversion correction coefficient in the absence of current passing through the power bus of the battery; and determining the output voltage of the hall sensor based on the second analog-to-digital conversion value of the output voltage of the hall sensor and the analog-to-digital conversion correction coefficient.

13. The controller according to claim 9, wherein the determining the output voltage of the hall sensor based on the second analog-to-digital conversion value and the analog-to-digital conversion correction coefficient comprising:

acquiring a first voltage dividing coefficient of a first voltage dividing circuit; and determining the output voltage of the hall sensor based on the first voltage dividing coefficient, the second analog-to-digital conversion value, and the analog-to-digital conversion correction coefficient.

14. The controller according to claim 9, wherein the determining the supply voltage of the hall sensor based on the third analog-to-digital conversion value and the analog-to-digital conversion correction coefficient comprising:

acquiring a second voltage dividing coefficient of a second voltage dividing circuit; and determining the supply voltage of the hall sensor based on the second voltage dividing coefficient, the third analog-to-digital conversion value, and the analog-to-digital conversion correction coefficient.

15. A current monitoring circuit, comprising a controller, a constant voltage source having an output terminal connected to a first input terminal of the controller, and a hall sensor having an output terminal connected to a second input terminal of the controller, and a power supply terminal connected to a third input terminal of the controller, the hall sensor being arranged within a power bus of a battery, wherein the controller is configured to:

acquire an output voltage of the constant voltage source and a first analog-to-digital conversion value of the output voltage of the constant voltage source;

determine an analog-to-digital conversion correction coefficient based on the output voltage of the constant voltage source and the first analog-to-digital conversion value, the analog-to-digital conversion correction coefficient representing a voltage value corresponding to a unit analog-to-digital conversion value at the time of sampling of the controller;

acquire a second analog-to-digital conversion value of an output voltage of the hall sensor and a third analog-to-digital conversion value of a supply voltage of the hall sensor; and determine the battery current based on the analog-to-digital conversion correction coefficient, the second analog-to-digital conversion value, and the third analog-to-digital conversion value.

16. The current monitoring circuit according to claim 15, wherein the determining the battery current based on the analog-to-digital conversion correction coefficient, the second analog-to-digital conversion value, and the third analog-to-digital conversion value comprises:

determining the output voltage of the hall sensor based on the second analog-to-digital conversion value and the analog-to-digital conversion correction coefficient;

determining the supply voltage of the hall sensor based on the third analog-to-digital conversion value and the analog-to-digital conversion correction coefficient; and determining the battery current based on the output voltage of the hall sensor and the supply voltage of the hall sensor.

17. The current monitoring circuit according to claim 16, wherein the determining the output voltage of the hall sensor based on the second analog-to-digital conversion value and the analog-to-digital conversion correction coefficient comprises:

determining an intermediate value of the output voltage of the hall sensor based on the second analog-to-digital conversion value and the analog-to-digital conversion correction coefficient;

acquiring a zero-point deviation value of the hall sensor, the zero-point deviation value of the hall sensor representing a deviation between a theoretical value and an actual measured value of the output voltage of the hall sensor in the absence of current passing through the power bus of the battery; and determining the output voltage of the hall sensor based on the zero-point deviation value and the intermediate value of the hall sensor.

18. The current monitoring circuit according to claim 17, wherein the acquiring the zero-point deviation value of the hall sensor comprises:

acquiring the output voltage and the supply voltage of the hall sensor in the absence of current passing through the power bus of the battery; and determining the zero-point deviation value of the hall sensor based on the output voltage and the supply voltage of the hall sensor.

19. The current monitoring circuit according to claim 18, wherein the acquiring the output voltage and the supply voltage of the hall sensor in the absence of current passing through the power bus of the battery comprises:

acquiring the second analog-to-digital conversion value of the output voltage of the hall sensor and the analog-to-digital conversion correction coefficient in the absence of current passing through the power bus of the battery; and determining the output voltage of the hall sensor based on the second analog-to-digital conversion value of the output voltage of the hall sensor and the analog-to-digital conversion correction coefficient.

20. The current monitoring circuit according to claim 16, wherein the current monitoring circuit further comprises a first voltage dividing circuit having an input terminal connected to the output terminal of the hall sensor, and an output terminal connected to the second input terminal of the controller, the determining the output voltage of the hall sensor based on the second analog-to-digital conversion value and the analog-to-digital conversion correction coefficient comprising:

acquiring a first voltage dividing coefficient of the first voltage dividing circuit; and determining the output voltage of the hall sensor based on the first voltage dividing coefficient, the second analog-to-digital conversion value, and the analog-to-digital conversion correction coefficient.

* * * * *